(12) United States Patent
Chou et al.

(10) Patent No.: US 9,653,682 B1
(45) Date of Patent: May 16, 2017

(54) RESISTIVE RANDOM ACCESS MEMORY STRUCTURE

(71) Applicant: TAIWAN SEMICONDUCTOR MANUFACTURING COMPANY LTD., Hsinchu (TW)

(72) Inventors: Chung-Yen Chou, Hsinchu (TW); Ching-Pei Hsieh, Kaohsiung (TW); Shih-Chang Liu, Kaohsiung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/017,245

(22) Filed: Feb. 5, 2016

(51) Int. Cl.
*H01L 45/00* (2006.01)
*H01L 27/24* (2006.01)

(52) U.S. Cl.
CPC ...... *H01L 45/1233* (2013.01); *H01L 27/2463* (2013.01); *H01L 45/1253* (2013.01); *H01L 45/146* (2013.01); *H01L 45/1608* (2013.01); *H01L 45/1683* (2013.01)

(58) Field of Classification Search
CPC .......... H01L 45/1233; H01L 27/2463
USPC ................................. 257/2, 4, 299
See application file for complete search history.

(56) References Cited

U.S. PATENT DOCUMENTS

| | | | |
|---|---|---|---|
| 9,331,277 B2* | 5/2016 | Chen | H01L 45/16 |
| 2006/0054950 A1* | 3/2006 | Baek | H01L 27/112 257/295 |
| 2008/0211036 A1* | 9/2008 | Zhao | H01L 27/112 257/379 |
| 2011/0227026 A1* | 9/2011 | Sekar | G11C 13/0007 257/4 |
| 2011/0291066 A1* | 12/2011 | Baek | H01L 45/08 257/4 |
| 2016/0190432 A1* | 6/2016 | Shum | H01L 43/02 257/427 |

* cited by examiner

*Primary Examiner* — Dung Le
(74) *Attorney, Agent, or Firm* — WPAT, P.C., Intellectual Property Attorneys; Anthony King; Kay Yang

(57) ABSTRACT

The present disclosure provides a semiconductor structure, including an $N^{th}$ metal layer, a planar bottom barrier layer over and in contact with the $N^{th}$ metal layer, a data storage layer over the planar bottom barrier layer, an electrode over the data storage layer, and an $(N+1)^{th}$ metal layer over the electrode. N is a positive integer. A manufacturing method for the semiconductor structure is also provided.

20 Claims, 14 Drawing Sheets

RESISTIVE RANDOM ACCESS MEMORY STRUCTURE

FIELD

The present disclosure relates to a semiconductor memory structure.

BACKGROUND

A semiconductor memory array includes a plurality of unit memory cells that are electrically connected to one another. In dynamic random access memory (DRAM), for example, a unit memory cell may include one switch and one capacitor. A DRAM has high integration density and high operation speed. However, when power is not supplied to the DRAM, data stored in the DRAM is erased. An example of non-volatile memory is flash memory, in which stored data is not erased when power is not supplied. Although flash memory has non-volatile characteristics, flash memory has low integration density and low operation speed as compared to DRAM.

Many modern day electronic devices contain electronic memory configured to store data. Electronic memory may be volatile memory or non-volatile memory. Volatile memory stores data while it is powered, while non-volatile memory is able to store data when power is removed. Resistive random access memory (RRAM) is one promising candidate for next generation non-volatile memory technology due to its simple structure and CMOS logic compatible process technology that is involved. An RRAM cell includes a dielectric data storage layer having a variable resistance, which is placed between two electrodes disposed within back-end-of-the-line (BEOL) metallization layers.

Resistive random access memory (RRAM) is one of the non-volatile memory devices. An RRAM is a resistive type memory based on a characteristic that a resistance of a transition metal oxide varies according to a voltage applied thereto, and the resistance is used to store a bit of data in an RRAM cell instead of an electronic charge used in the DRAM. An RRAM consists of a capacitor like structure in which the insulating materials show a resistive switching behavior.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
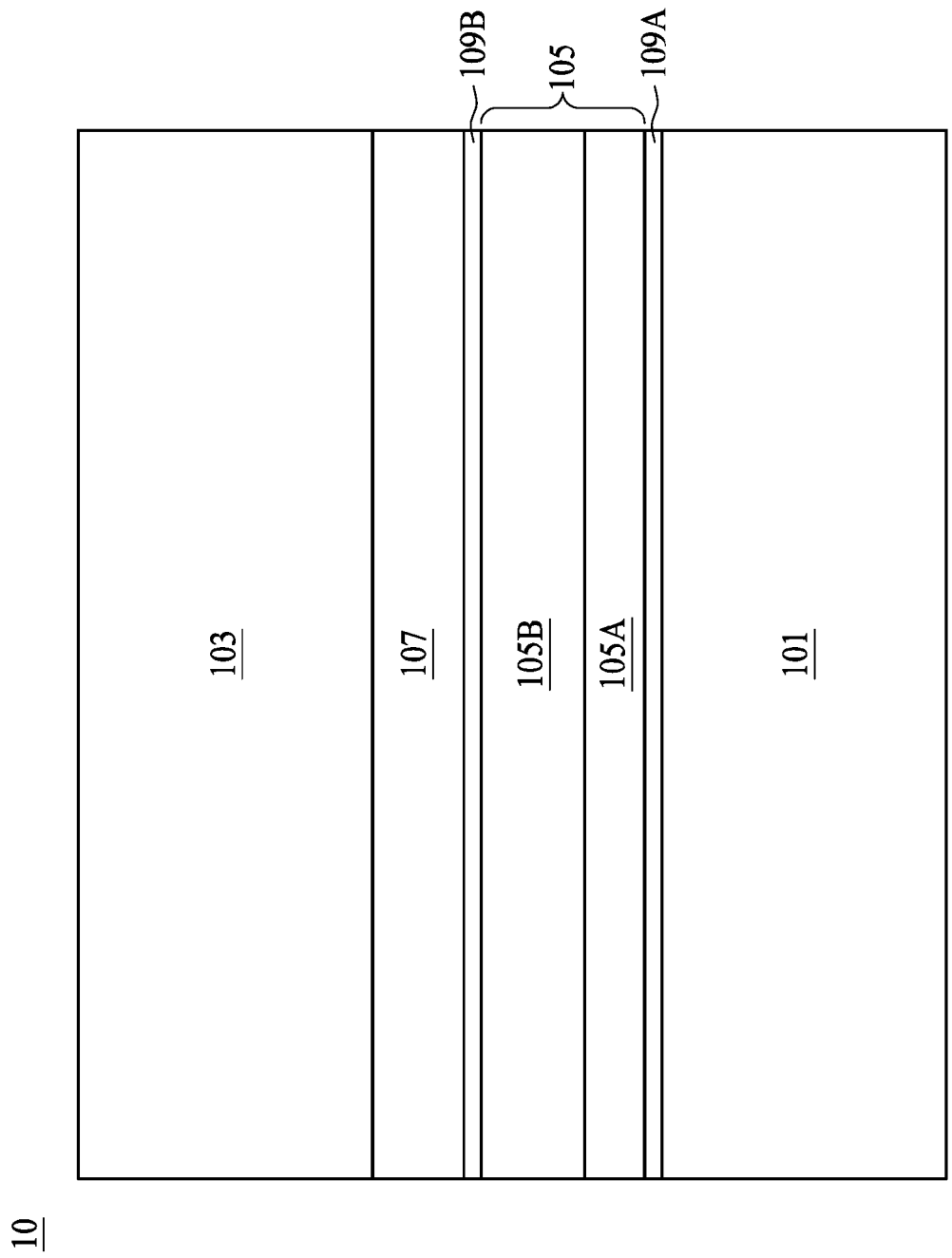
FIG. 1 is a cross section of a memory structure stack according to some embodiments of the present disclosure.

In the drawings, like reference numbers are used to designate like or similar elements throughout the various views, and illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In describing and claiming the present disclosure, the following terminology will be used in accordance with the definitions set forth below.

As used herein, a "substrate" refers to a bulk substrate on which various layers and device structure are formed. In some embodiments, the bulk substrate includes silicon or a compound semiconductor, such as GaAs, InP, Si/Ge, or SiC. Examples of the layers include dielectric layers, doped layers, polysilicon layers or conductive layers. Examples of the device structures include transistors, resistors, and/or capacitors, which may be interconnected through an interconnect layer to additional integrated circuits.

As used herein, "deposition" refers to operations of depositing materials on a substrate using a vapor phase of a material to be deposited, a precursor of the material, an electrochemical reaction, or sputtering/reactive sputtering. Depositions using a vapor phase of a material include any operations such as, but not limited to, chemical vapor deposition (CVD) and physical vapor deposition (PVD). Examples of vapor deposition methods include hot filament CVD, rf-CVD, laser CVD (LCVD), conformal diamond coating operations, metal-organic CVD (MOCVD), thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like. Examples of deposition using electrochemical reaction include electroplating, electro-less plating, and the like. Other examples of deposition include pulse laser deposition (PLD), and atomic layer deposition (ALD).

As used herein, "metal oxide" refers to binary metal oxides, transition metal oxides, and lanthanide series metal oxides. The metal oxides described herein are often nonsoichiometric, thus a subscript "x" for the oxygen composition is used in the present disclosure. The metal oxide includes $MgO_x$, $AlO_x$, $TiO_x$, $CrO_x$, $MnO_x$, $FeO_x$, $CoO_x$, $NiO_x$, $CuO_x$, $ZnO_x$, $GeO_x$, $YO_x$, $ZrO_x$, $NbO_x$, $MoO_x$, $SnO_x$, $LaO_x$, $HfO_x$, $TaO_x$, $WO_x$, $CeO_x$, $GdO_x$, $YbO_x$, and $LuO_x$.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Resistive random access memory (RRAM) cells have a bottom electrode that is separated from an overlying top electrode by a data storage layer having a variable resistance. Typically, RRAM cells are separated from an underlying metal layer by a bottom dielectric layer comprising an opening that provides for contact between the bottom electrode and the underlying metal interconnect layer. The bottom electrode so formed in the RRAM is called bottom electrode via (BEVA) herein.

The BEVA cause a number of problems in an RRAM cell. For example, BEVA is conventionally formed by a deposition operation which fills the opening connecting the bottom electrode and the underlying metal interconnect layer. Depending on the size of the opening, voids can be formed in openings with a critical dimension (CD) below 60 nm. Subsequent planarization operation such as a chemical mechanical polishing (CMP) cannot create a flat surface due to the void formation nature of small CD openings. Furthermore, as a result of the planarization operation, the polished surface includes more than one materials such as BEVA per se (made of TiN, for example), TaN barrier lining the sidewall and bottom of the BEVA, and silicon-rich oxides (SRO) surrounding the BEVA. CMP slurry may possess different polishing rate over different materials. Hence, a polished surface having more than one material inherently possesses a non-flat surface that is detrimental to the subsequent data storage layer formation. Consequently, voids resulted in opening-filling and the non-flat surface after polishing contribute to the non-flatness of the polished surface. The flatness of the polished surface is crucial to the RRAM cell performance since only a high-k dielectric layer with satisfying even thickness across the RRAM cell could provide desired memory performance. In other words, the BEVA in conventional approach faces difficulties because a flat polished surface cannot be obtained.

Furthermore, the alignment of BEVA relative to the RRAM cell also causes problems. BEVA formation is associated with a first lithography operation which error such as overlay is unavoidable as far as smaller device scale is concerned. For example, when the CD of a BEVA decreases under 60 nm, lithography overlay can be observed. The overlay results to a BEVA aligning not to a center of the RRAM cell but shifted toward a left side or a right side of the RRAM cell. Serious shifting induces defects in subsequent second lithography operation when the data storage layer is patterned over the BEVA. Aligning BEVA in proximity to the center of the RRAM cell is highly desired.

Finally, the CD of BEVA is also problematic due to lithography limit. As the device scales smaller and smaller, BEVA encounters a lithography limit typically around 40 nm.

Given the above discussion, a semiconductor memory structure, especially an RRAM structure is provided to solve the aforesaid problem. Present disclosure provides an RRAM structure that is inversely disposed with respect to the conventional RRAM structure. The term BEVA is not appeared in the present disclosure because the only electrode in the RRAM structure disclosed herein is closer to an upper metal layer instead of to the lower metal layer. The electrode of the present RRAM cell is disposed over the data storage layer instead of under the data storage layer. Therefore, the aforesaid polished surface can achieve greater flatness of desire. Furthermore, the electrode of the present RRAM cell is formed by a self-aligning operation rather than by a lithography operation. The CD limit and the alignment of the electrode with respect to the center of the RRAM cell are therefore improved.

For example, one embodiment in the present disclosure provides a semiconductor structure, including an $N^{th}$ metal layer, a planar bottom barrier layer over and in contact with the $N^{th}$ metal layer, a data storage layer over the planar bottom barrier layer, an electrode over the data storage layer, and an $(N+1)^{th}$ metal layer over the electrode. N is a positive integer. For another example, one embodiment in the present disclosure provides a memory structure including a lower metal layer, a planar memory cell over the lower metal layer, an upper metal layer electrically coupled to the planar memory cell. The lower metal layer is closer to a transistor region than the upper metal layer. The planar memory cell includes a capping layer in proximity to the lower metal layer; and a high-k dielectric layer over the capping layer. Manufacturing method for the semiconductor structure described herein is also disclosed.

Referring to FIG. 1, FIG. 1 is a cross section of a memory stack 10 according to some embodiments of the present disclosure. In FIG. 1, the memory stack 10 includes an $N^{th}$ metal layer 101 and an $(N+1)^{th}$ metal layer 103. In some embodiments, the $N^{th}$ metal layer 101 can be a metal line of a fourth metal layer, and the $(N+1)^{th}$ metal layer 103 can be a metal via and/or a metal line of a fifth metal layer. Note the $N^{th}$ metal layer referred herein is the metal interconnects above a logic region or a transistor region in a CMOS structure or the like. The substrate of the CMOS structure is omitted in FIG. 1 for brevity.

The metal interconnects is a structure formed in a back-end-of-line (BEOL) operation. Nevertheless, in some embodiments, the $N^{th}$ metal layer 101 and the $(N+1)^{th}$ metal layer 103 are not limited to the adjacent metallization layers. The $N^{th}$ metal layer 101 may be a lower metal layer, and the $(N+1)^{th}$ metal layer 103 may be an upper metal layer. For example, the lower metal layer can be a fourth metal line and the upper metal layer can be a metal via and/or a metal line of a sixth metal layer. In some embodiments, the metal interconnects include Al, Cu, Ti, Ta, W, Mo, TaN, NiSi, CoSi, TiN, WN, Si, or combination thereof.

In FIG. 1, a memory cell 105 is disposed between the $N^{th}$ metal layer 101 and the $(N+1)^{th}$ metal layer 103. Note the memory cell 105 of the present disclosure is inversely disposed as oppose to a conventional memory cell. For example, compared to a data storage layer 105B, a capping layer 105A is disposed closer to the $N^{th}$ metal layer 101 or the lower metal layer, whereas the data storage layer 105B is disposed closer to the $(N+1)^{th}$ metal layer 103 or the upper metal layer. In some embodiments, the capping layer 105A may comprise a metal such as titanium (Ti), hafnium (Hf), platinum (Pt), ruthenium (Ru), and/or aluminum (Al). In other embodiments, the capping layer 105A may comprise a metal oxide such as titanium oxide ($TiO_x$), hafnium oxide ($HfO_x$), zirconium oxide ($ZrO_x$), germanium oxide ($GeO_x$), cesium oxide ($CeO_x$). The data storage layer 105B may comprise at least one of dielectric materials having a high-k dielectric constant, binary metal oxides, transition metal oxides, and lanthanide series metal oxides. In some embodiments, the data storage layer 105B includes hafnium oxide ($HfO_x$), zirconium oxide ($ZrO_x$), aluminum oxide ($AlO_x$), nickel oxide ($NiO_x$), tantalum oxide ($TaO_x$), or titanium oxide ($TiO_x$).

In some embodiments, the data storage layer 105B may include electric field enhancers in a form of quantum dots composed of conductive materials such as Pt, AlCu, TiN, Au, TaN, W, WN, Cu, Ni, Zr, and the combination thereof. However, the electric field enhancers are not limited to materials listed above, any kinds of conductive materials are within the contemplated scope of the present disclosure. In certain embodiments, the electric field enhancers include conductive materials that are capable of depriving oxygen from the data storage layer 105B. For example, Ti, Ta, and Hf. It is known in the art that certain metal acts as an oxygen reservoir depleting the oxygen atoms from the oxide in contact therewith. Since the data storage layer 105B includes binary metal oxides, transition metal oxides, and lanthanide series metal oxides, oxygen atoms in said oxides are depleted from the data storage layer 105B when brining it in contact with the oxygen-depriving metal. Consequently the oxygen vacancies being left in the data storage layer 105B is used to assist the formation and the SET process of the RRAM.

Still referring to FIG. 1, an electrode 107 is disposed over the memory cell 105 and is closer to the data storage layer 105B than the capping layer 105A. In some embodiments, the electrode 107 may comprise a metal nitride (e.g., titanium nitride (TiN) or tantalum nitride (TaN)) or a metal (e.g., titanium (Ti) or tantalum (Ta)). Note the memory cell 105 is sandwiched between a bottom barrier layer 109A and an upper barrier layer 109B. The bottom barrier layer 109A can be a diffusion barrier preventing metal atoms in the $N^{th}$ metal layer 101 from diffusing into the capping layer 105A of the memory cell 105. The upper barrier layer 109B can also be a diffusion barrier preventing metal atoms in the electrode 107 from diffusing into the data storage layer 105B of the memory cell 105. In some embodiments, the bottom barrier layer 109A is composed of identical material as those of the upper barrier layer 109B. In some embodiments, the bottom barrier layer 109A and the upper barrier layer 109B are having a planar shape conforming to a top surface of the $N^{th}$ metal layer 101. In some embodiments, the bottom barrier layer 109A and the upper barrier layer 109B are made of tantalum nitride (TaN).

Figure 2:
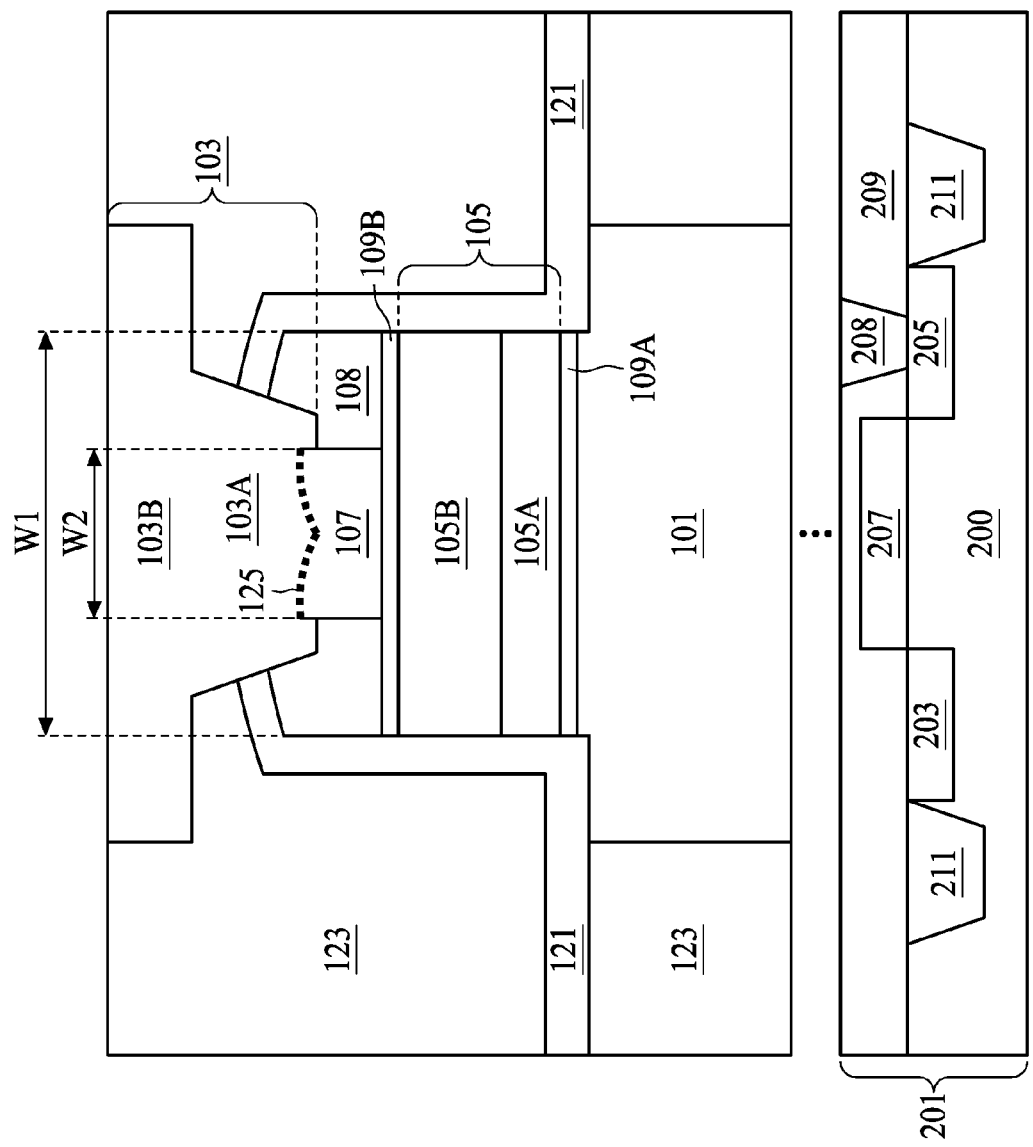
FIG. 2 is a cross section of a memory cell according to some embodiments of the present disclosure.

FIG. 2 is a cross section of a memory cell 20 according to some embodiments of the present disclosure. Identical numeral labels in FIG. 2 are referring to the identical elements or equivalents as discussed in FIG. 1 and are not repeated here for brevity. In FIG. 2, the lower metal layer 101 is surrounded by dielectric layer 123. Memory cell 105 is disposed over the lower metal layer 101 with a predetermined width W1. In some embodiments, the memory cell width W1 is in a range of from about 50 nm to about 250 nm Details of the memory stacks such as the barrier layer 109A, 109B and the capping layer 105A, the data storage layer 105B are previously discussed. The electrode 107 is disposed over the memory cell stack, landing over the upper barrier layer 109B. The electrode 107 is surrounded by a spacer layer 108, for example, a nitride layer. Note the electrode 107 includes a width W2 smaller than the width W1 of the memory cell 105. In some embodiments, the width W2 can be in a range of from about 20 nm to about 40 nm. One having ordinary skill in the art may understand the critical dimension of the electrode 107 encounters its lithography limit under 40 nm. The width W2 of the electrode 107 provided in the present disclosure is achieved by circumventing the lithography limit and adopting a self-aligning operation as will be discussed below in the manufacturing method for the memory structure 20.

As shown in FIG. 2, the lower metal layer 101 is closer to a transistor region 201 than the upper metal layer 103. The semiconductor substrate 200 further includes heavily doped regions such as sources 203 and drains 205 at least partially in the semiconductor substrate 200. A gate 207 is positioned over a top surface of the semiconductor substrate 200 and between the source 203 and the drain 207. Contact plugs 208 are formed in inter-layer dielectric (ILD) 209, and may be electrically coupled to the transistor structure 201. In some embodiments, the ILD 209 is formed on the semiconductor substrate 200. The ILD 209 may be formed by a variety of techniques for forming such layers, e.g., chemical vapor deposition (CVD), low-pressure CVD (LPCVD), plasma-enhanced CVD (PECVD), sputtering and physical vapor deposition (PVD), thermal growing, and the like. The ILD 109 above the semiconductor substrate 200 may be formed from a variety of dielectric materials and may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like.

FIG. 2 shows a planar transistor having a doped region in the semiconductor substrate 200. However, the present disclosure is not limited thereto. Any non-planar transistor, such as a FinFET structure, can have raised doped regions.

Note the position of the electrode 107 is substantially at the center of the memory cell 105. In other words, a distance from the electrode 107 to the left sidewall of the spacer layer 108 is substantially identical to a distance from the electrode 107 to the right sidewall of the spacer layer 108. Due to the self-aligning operation as will be described later, the position of the electrode 107 is not defined by lithography operation where an overlay shift frequently occurs. The position of the electrode 107 is determined after the spacer layer 108 is formed.

Still referring to FIG. 2, a top surface 125 of the electrode 107 shows a ripple shape due to the fact that the electrode 107 is formed by a depositing conductive materials in an opening of the spacer layer 108. The conformal nature of the deposition operation create such a ripple shape at the top surface 125 of the electrode 107. Because the top surface 125 of the electrode 107 is the surface away from the memory cell 105, in other words, the morphology of the top surface 125 does not affect the thickness of the data storage layer 105b of the memory cell 105, thus the planarity of such surface is not as critical as the planarity of the bottom barrier layer 109A, as previously discussed. In some embodiments, the ripple surface of the electrode 107 is in contact with a metal via 103A of the upper metal layer 103.

Further shown in FIG. 2, a protection layer 121 is formed lining a sidewall of the spacer layer 108, a portion of the upper metal layer 103, and the memory cell 105. In some embodiments, the protection layer 121 is made of carbide material. In addition, dielectric layer 123, such as an intermetal dielectric, is formed surrounding the memory structure 20.

Figure 3:
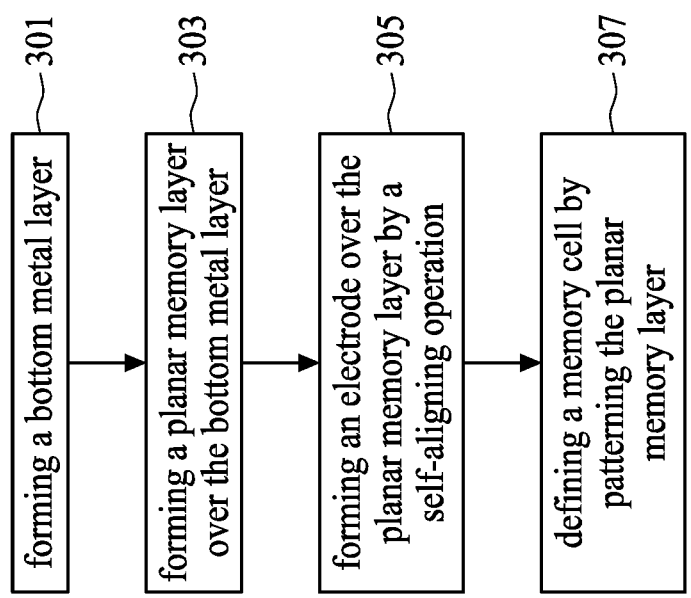
FIG. 3 is a flow chart of manufacturing a memory structure according to some embodiments of the present disclosure.
Figure 4:
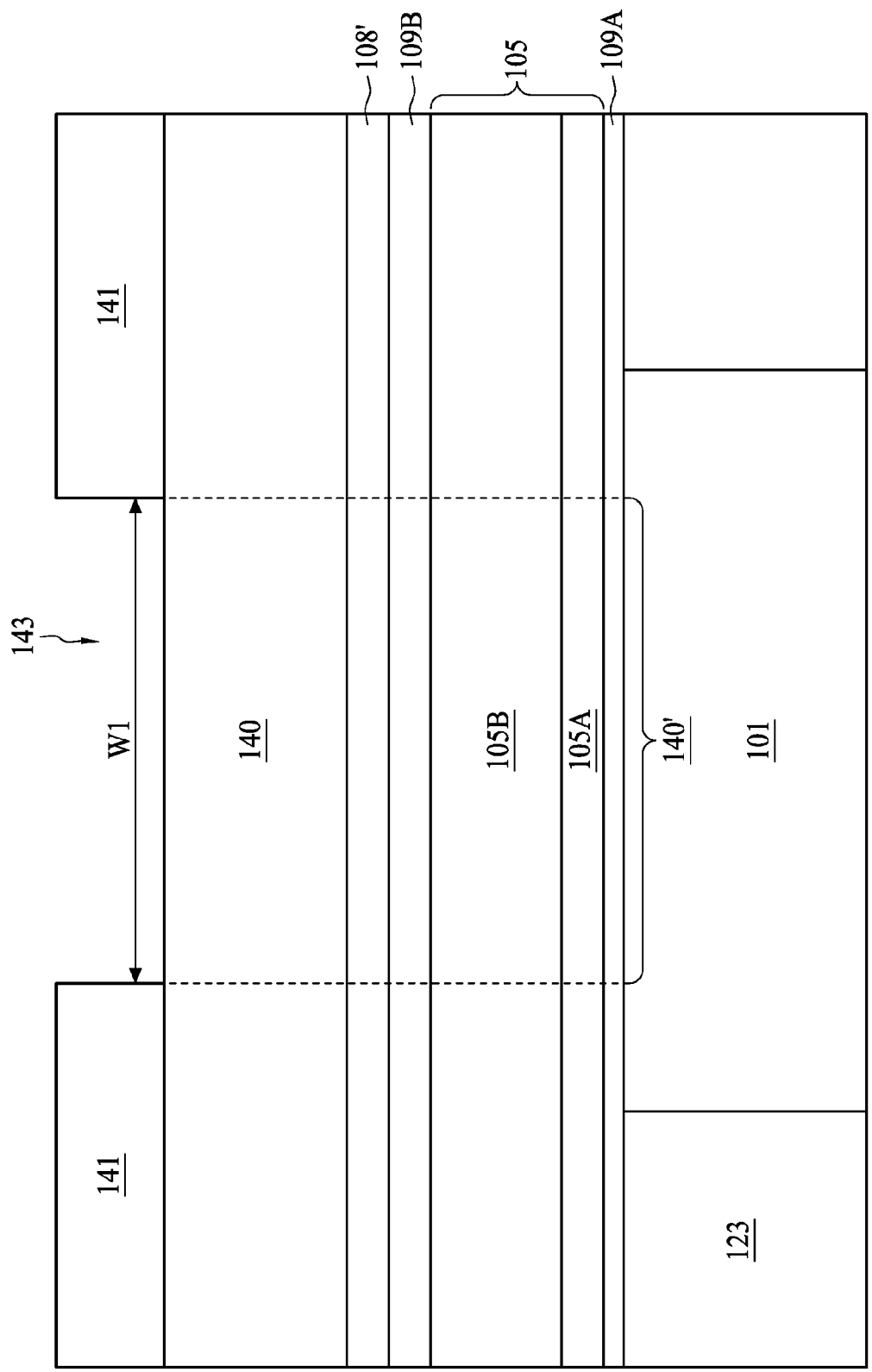
FIG. 4 to FIG. 14 are cross sections of a memory structure at various manufacturing operations according to some embodiments of the present disclosure.

Referring now to FIG. 3, a flowchart of manufacturing a memory structure according to some embodiments of the present disclosure is shown. Operation 301 provides forming a bottom metal layer. Operation 303 provides forming a planar memory layer over the bottom metal layer. Operation 305 provides forming an electrode over the planar memory layer by a self-aligning operation. Operation 307 provides defining a memory cell by patterning the planar memory layer. Further illustration of each aforesaid operation is provided in the following discussion directed to FIG. 4 to FIG. 14. Additional operation can be provided before, during, or after the operations in FIG. 3. Following figures have been simplified for a better understanding of the inventive concepts of the present disclosure FIG. 4 to FIG. 14 are cross sections of a memory structure at various manufacturing operations according to some embodiments of the present disclosure. In FIG. 4, as described in operation 301 and 303, a bottom metal layer 101, for example, a fourth metal line, and a planar memory layer 105 are formed. In some embodiments, the bottom metal layer 101 is formed by a Damascene process. Subsequently, a bottom barrier layer 109A composed of metal nitride is formed by chemical vapor deposition (CVD), ALD, high density plasma CVD (HDPCVD) or pulse laser deposition (PLD). The capping layer 105A including titanium (Ti), hafnium (Hf), platinum (Pt), ruthenium (Ru), and/or aluminum (Al) or metal oxides such as titanium oxide ($TiO_x$), hafnium oxide ($HfO_x$), zirconium oxide ($ZrO_x$), germanium oxide ($GeO_x$), cesium oxide ($CeO_x$) can be formed by a vapor deposition technique (e.g., physical vapor deposition, chemical vapor deposition, etc.) Furthermore, the upper barrier layer 109B is planar formed over the planar memory layer.

In FIG. 4, a dielectric layer 123 is surrounding the bottom metal layer 101. In some embodiments, dielectric layer 123 is an etch stop layer including at least one of silicon carbide, silicon oxynitride, and silicon nitride. In some embodiments, dielectric layer 123 includes silicon oxide, fluorinated silica glass (FSG), carbon doped silicon oxide, silicon nitride, silicon oxynitride, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric materials, or combination thereof.

Note the interface 140' between the lower metal line 101 and the planar memory layer (105A, 105B) is substantially flat with only a single material, for example, copper, at the side of the lower metal line 101. Hence, the planarity of the planar memory layer can be controlled. An etch stop layer 108' is then deposited over the upper barrier layer 109B to function as an etch stop to the etching of the overlying masking layer 140. A photoresist 141 is patterned over the masking layer 140 in order to further defining the pattern of the masking layer 140. In some embodiments, a first opening 143 of the photoresist 141 exposes a portion of the masking layer 140 by a width W1. The width W1 can be predetermined to be a width of the memory cell in subsequent manufacturing operations. In some embodiments, the masking layer 140 can be a dielectric layer, for example, a silicon-rich oxide layer. Etching selectivity between the masking layer 140 and the etch stop layer 108' is large enough to stop the etch when the etch stop layer 108' is reached.

Figure 5:
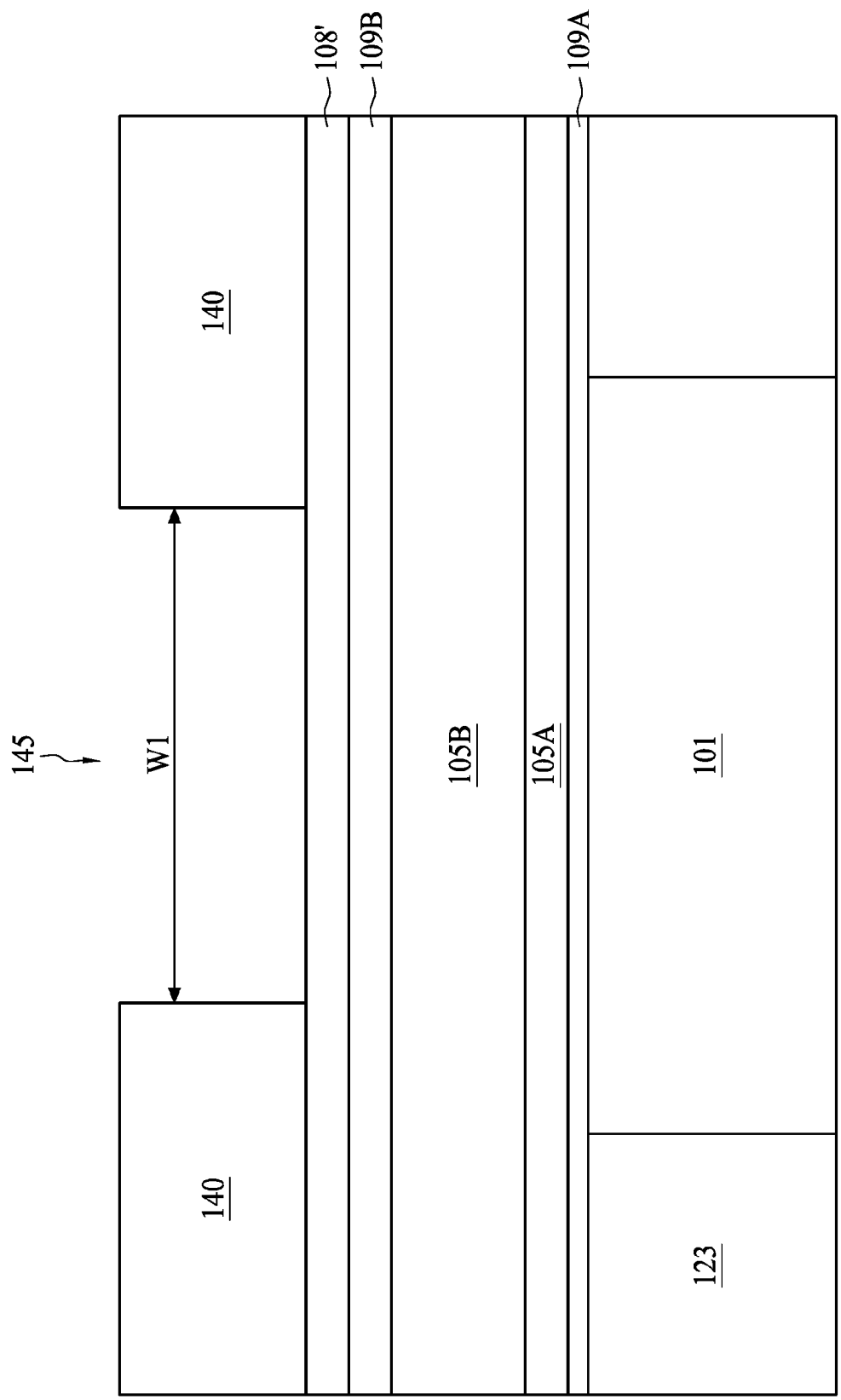
Figure 6:
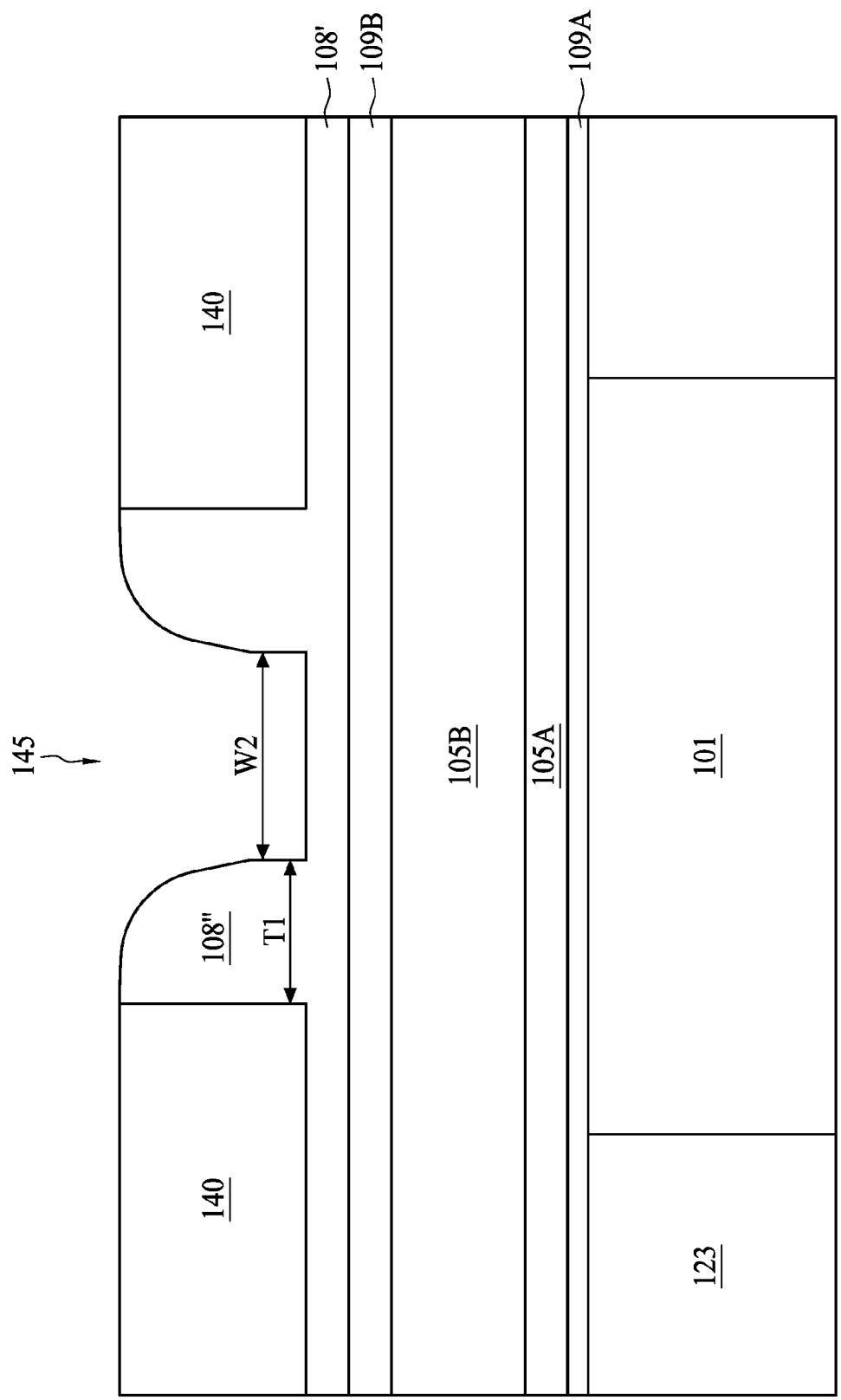
Figure 7:
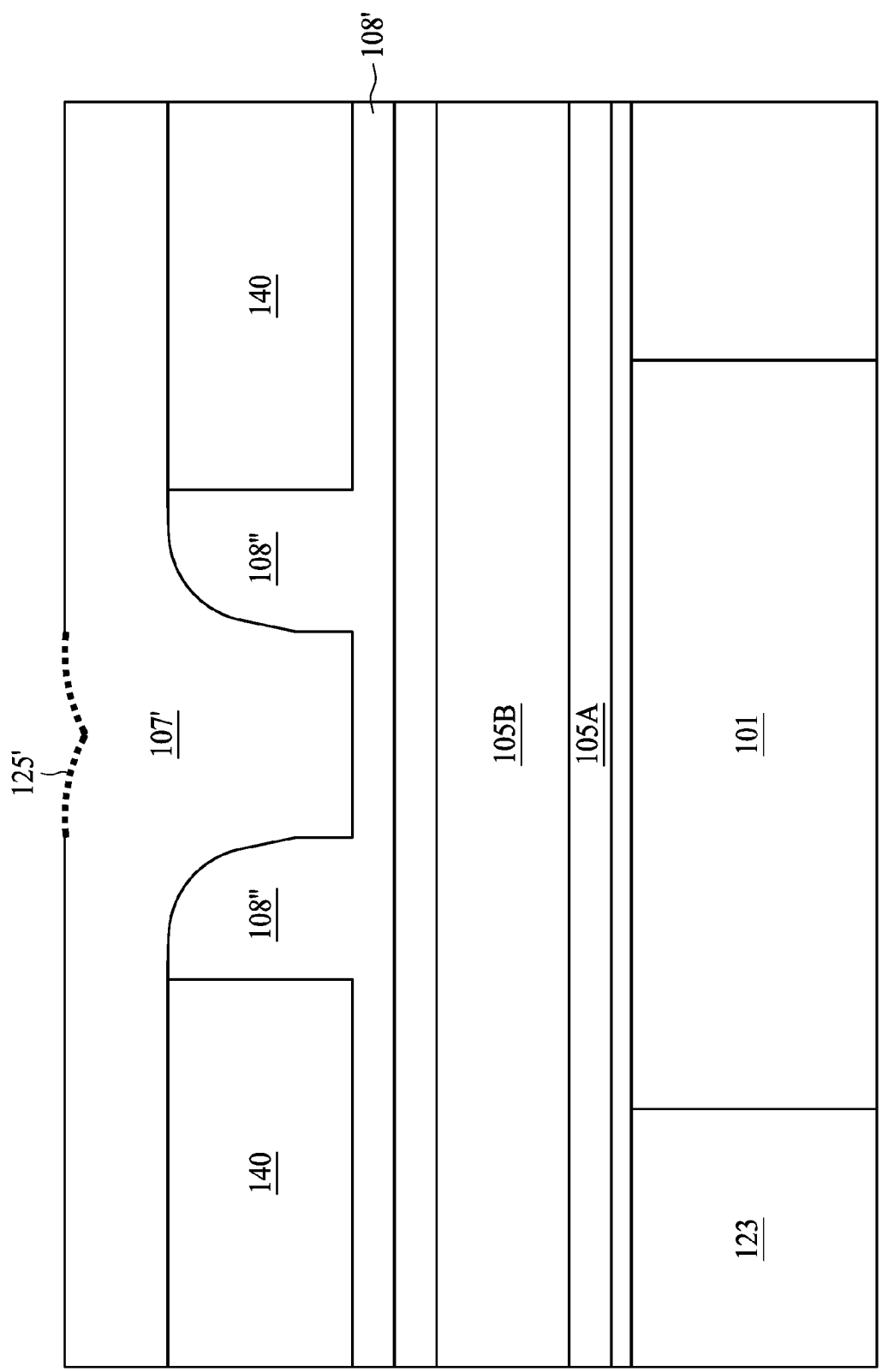
Figure 8:
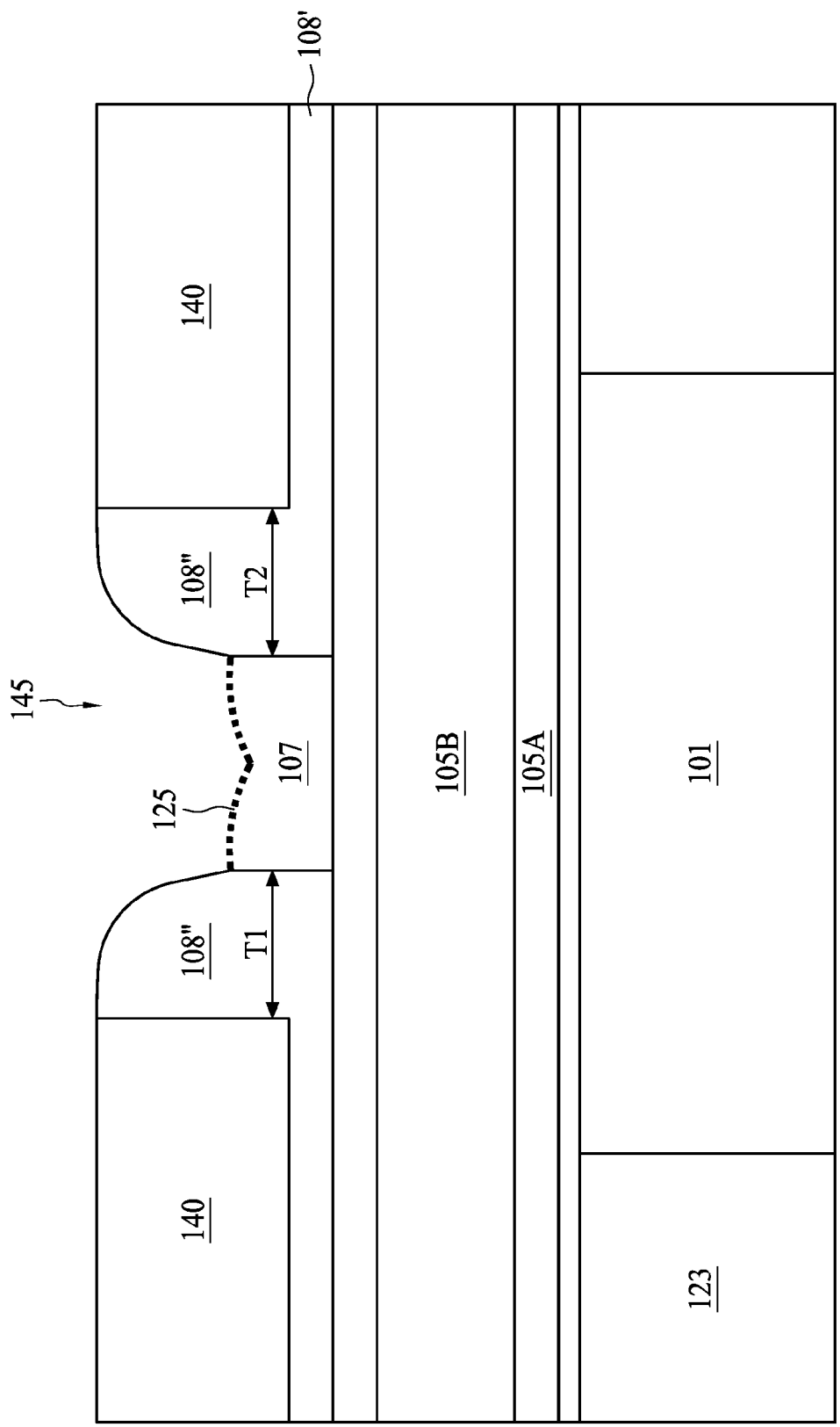

Referring to FIG. 5, the photoresist 141 is removed after the formation of the second opening 145 in the masking layer 140. In some embodiments, the transferring width W1 of the second opening 145 is in a range of from about 50 nm to about 250 nm. FIG. 6 to FIG. 8 show a self-aligning operation for the formation of the electrode 107, as described in operation 305 of FIG. 3. In FIG. 6, a spacer layer 108" is blanket formed over the top surface and the sidewall of the masking layer 140. In some embodiments, the spacer layer 108" can be composed of identical material as the etch stop layer 108'. For example, the spacer layer 108" and the etch stop layer 108' are made of silicon nitride. A directional etch is then applied to remove the portion of the spacer layer 108" over the top surface of the masking layer 140 and over the bottom of the second opening 145. Consequently, the spacer layer 108" remains at the sidewall of the masking layer 140, and a portion of the upper barrier layer 109A is exposed. A width W2 is then defined after the deposition and directional removal of the spacer layer 108".

As shown in FIG. 6, the width W2 is determined both by the width W1 and a thickness T1 of the spacer layer 108". In other words, the width W2, or can be shown subsequently the width of the electrode 107, can be predetermined by designing the width W1 and the thickness T1. In some embodiments, the width W2 is in a range of from about 20 nm to about 150 nm.

Referring to FIG. 7, an electrode layer 107' is deposited over the top surface of the masking layer 140 and to be filled into the second opening 145 of the making layer 140. The electrode layer 107' can be composed of at least one of the following materials Pt, AlCu, TiN, Au, Ti, Ta, TaN, W, WN, Cu. In some embodiments, the method forming the electrode layer 107' includes electro-less plating, sputtering, electro plating, physical vapor deposition (PVD), or atomic layer deposition (ALD). In a case of forming the electrode layer 107' with ALD operation, a ripple surface 125' can be observed between the spacer layers 108". This ripple surface feature is unavoidable right after the deposition of the electrode layer 107' due to the existence of the second opening 145 prior to the deposition. The ripple surface feature would be carried on after a direct etch-back operation, as shown in FIG. 8. Alternatively, the ripple surface feature can be eliminated by inserting a planarization operation prior to the etch back operation. The result is shown in FIG. 9.

Referring to FIG. 8, an etch back operation is performed to remove the electrode layer 107' from the top surface of the masking layer 140 and from the region inside the second opening 145. In some embodiments, the etch back operation is applied by using an end point detection etching and followed by a time mode etching. For example, the top surface of the masking layer 140 is detected in the former stage of the etch back as an end point and subsequently a time mode etching is adopted to remove the electrode material inside the second opening 145. Note the etchant used in the etch back operation possesses sufficient selectivity between two nitride materials. For example, the etchant used has a greater etching rate to TiN and has a slower etching rate to SiN. In this connection, the etch back operation mainly remove the electrode layer 107' and causing minor impact on the spacer layer 108". In some embodiments, the time mode etching is controlled to remove the electrode layer 107' to a height less than a one half of the height of the second opening 145. However, the final height of the electrode layer 107' is not limited thereto. Other suitable heights are encompassed in the contemplated scope of the present disclosure.

Still referring to FIG. 8, the ripple surface 125' from FIG. 7 is carried after the etch back operation. In some embodiments, a seam or void may be present in proximity to the center of the ripple. As shown in FIG. 8, the electrode 107 is formed between two spacer layers 108. As discussed previously, the space layer 108 is blanket formed over the masking layer 140 and the second opening 145, the thickness T1 of the spacer layer 108 close to the left side of the second opening 145 is substantially the same as the width T2 of the spacer layer 108 close to the right side of the second opening 145. Therefore, the electrode 107 is formed substantially at the center of the width W1, as defined in FIG. 5. As will be discussed below, the width W1 may turn into the width of the memory cell, the electrode 107 is self-aligned to be formed at the center of the memory cell. Compared to the conventional approach where a width of the electrode is relied on a lithography operation, the self-aligning scheme provided here may further decrease the width of the electrode and follow the miniaturizing trend of the device scale.

Figure 9:
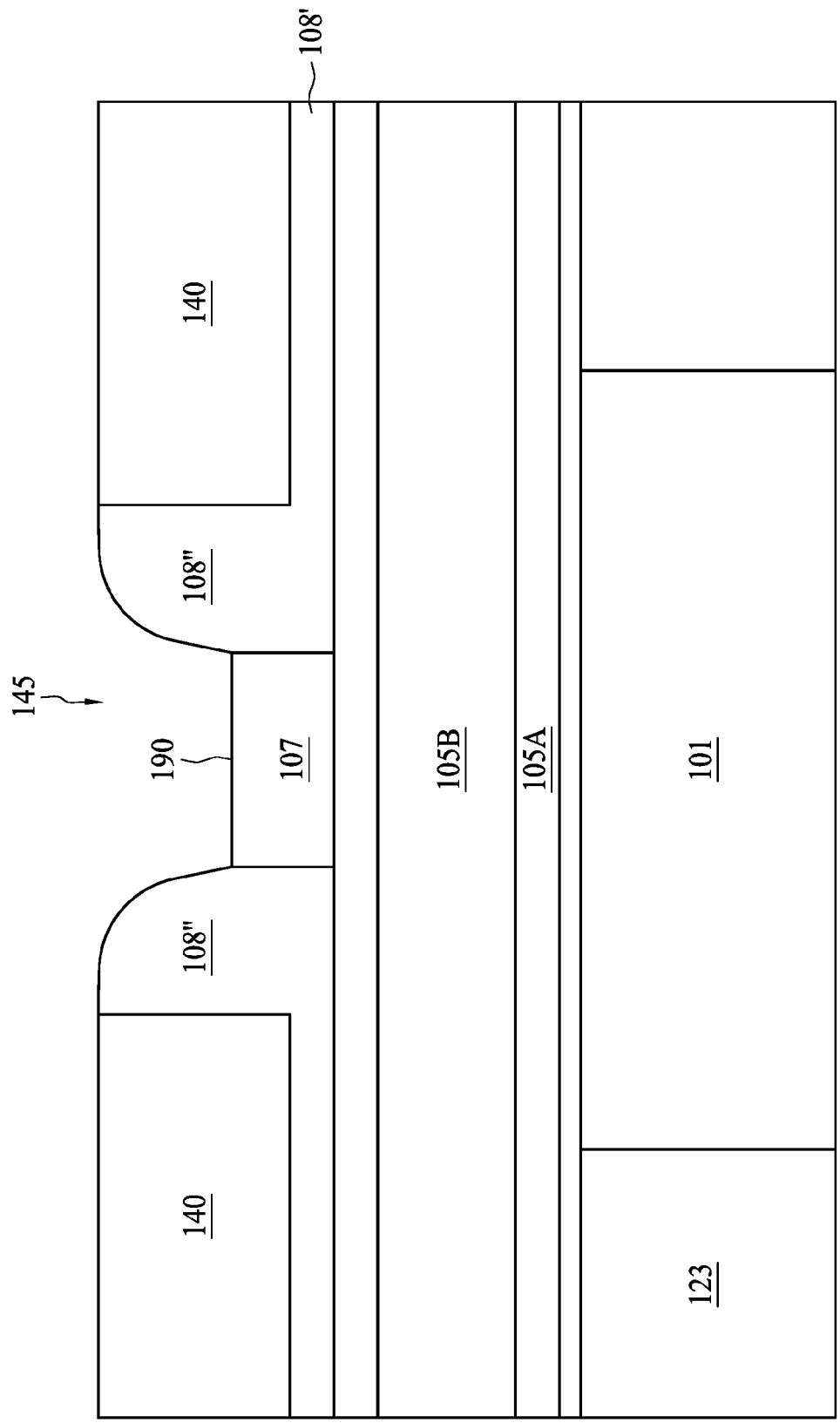

FIG. 9 is an alternative operation of forming the electrode 107 where a planarization operation is performed before the etch back operation. As seen in FIG. 9, the electrode 107 is having a nearly flat surface 190. Referring back to FIG. 7, after the deposition of the electrode layer 107', a planarization operation is performed to remove the ripple surface 125' from the topmost electrode layer 107'. In some embodiments, the planarization operation may comprise a chemical mechanical polishing (CMP) process. After the planarization operation, the etch back operation previously discussed can be performed to remove the electrode layer 107' in the second opening 145 until a desired height is reached.

Figure 10:
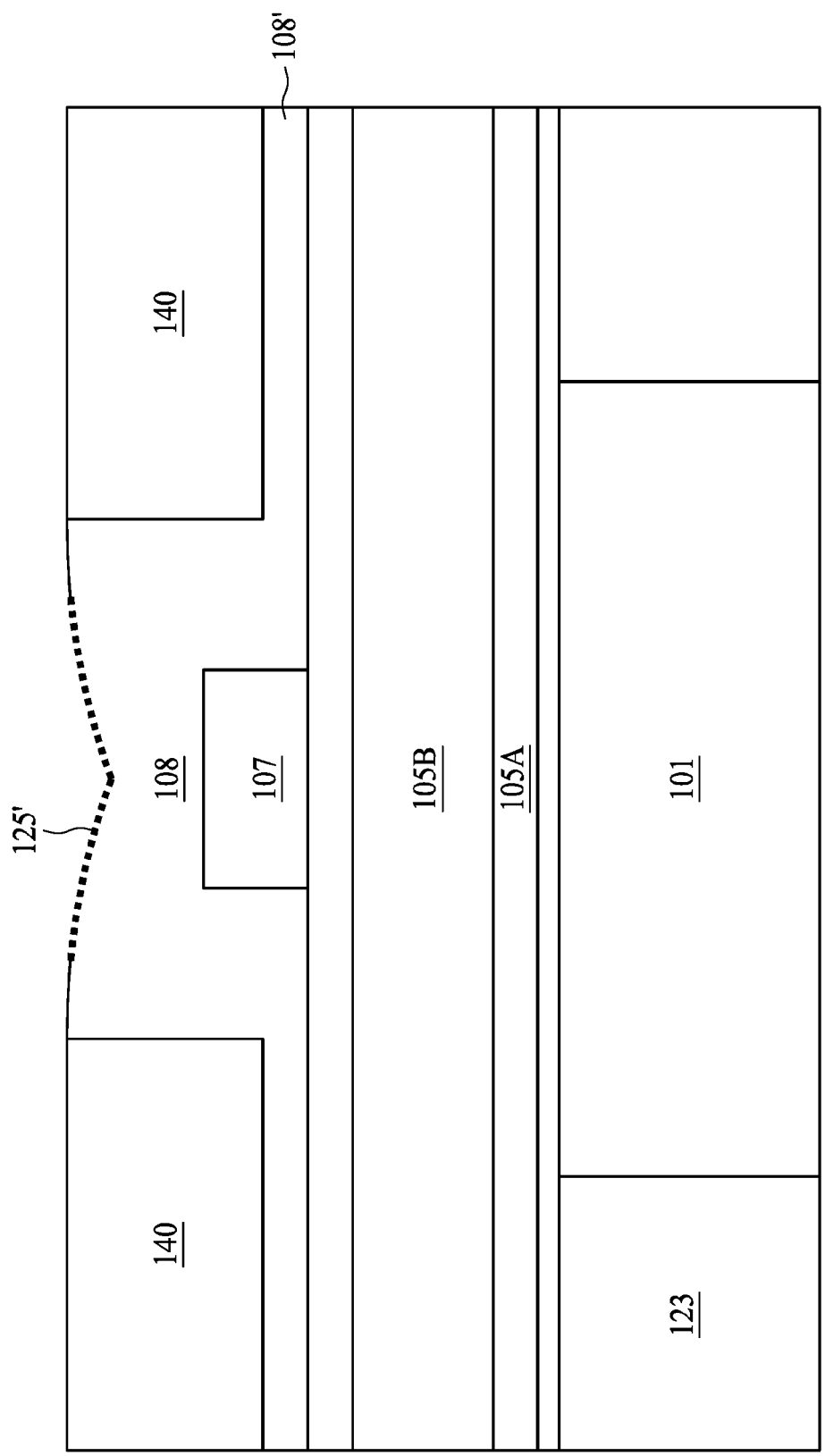
Figure 11:
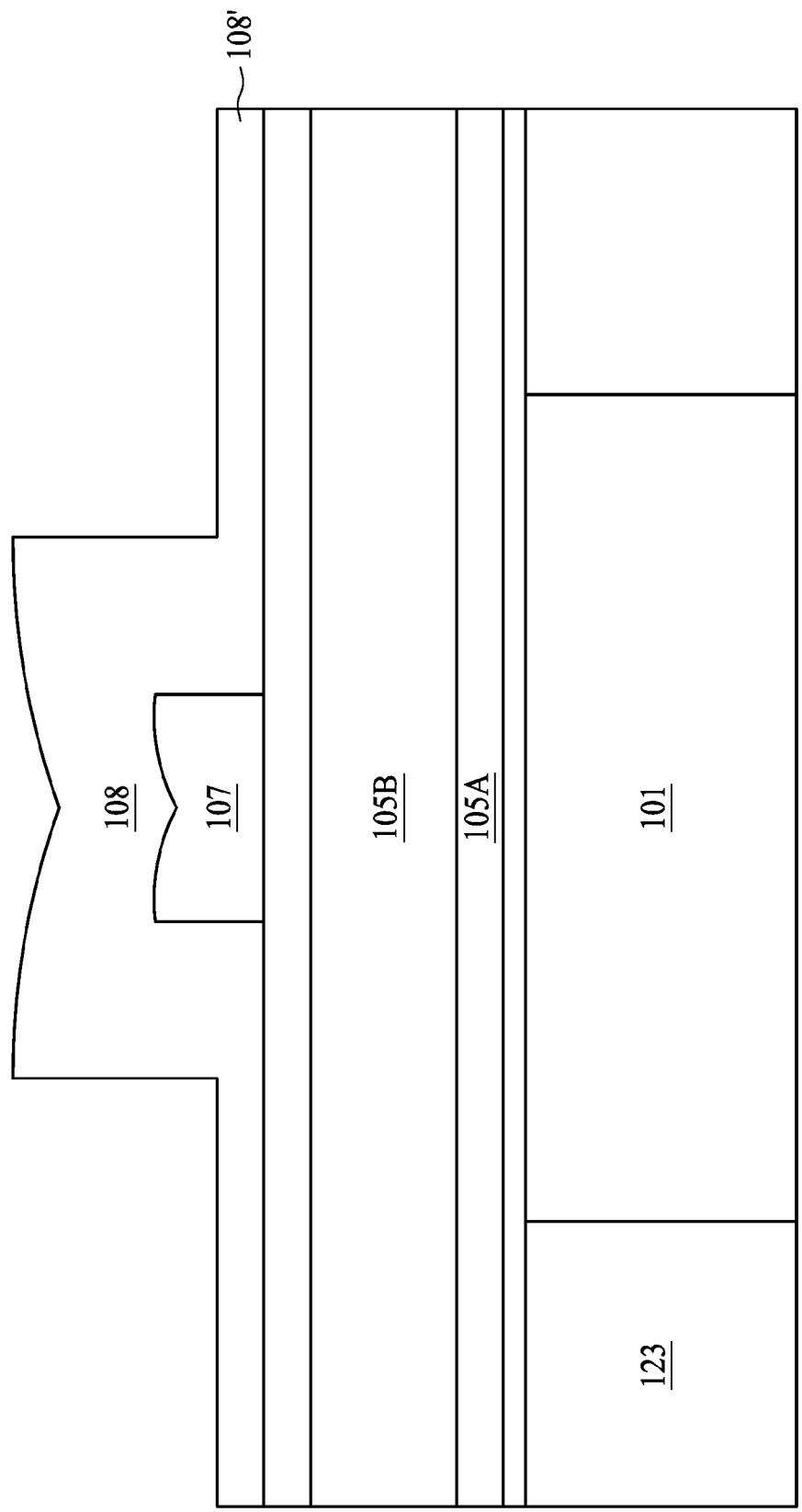
Figure 12:
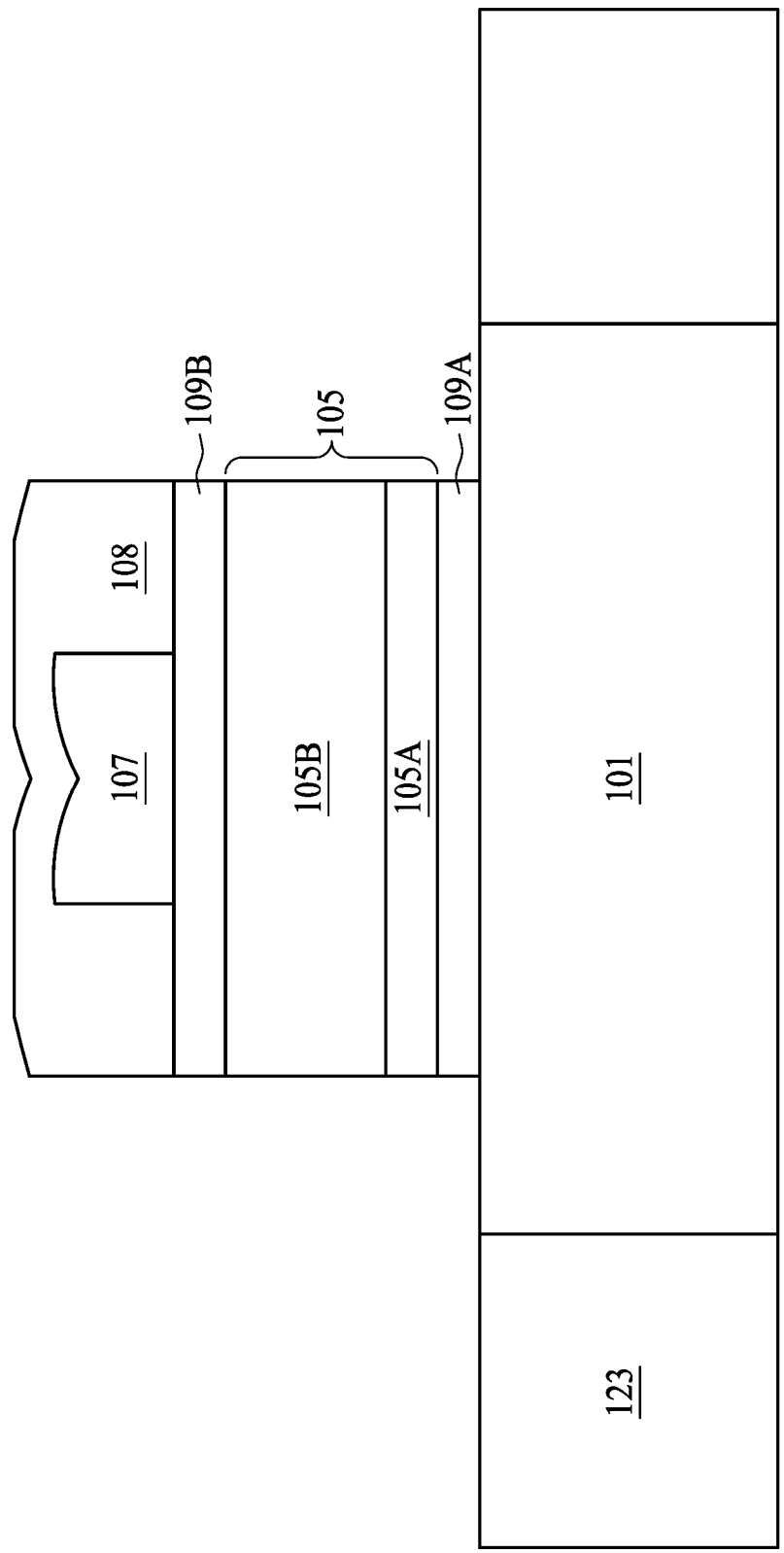

FIG. 10 to FIG. 12 illustrate a formation of a memory cell 105 by patterning memory cell layers (105A, 105B) using a hard mask layer. In FIG. 10, a second deposition of the spacer layer 103 is performed. In some embodiments, the second deposition of the spacer layer is formed over the top surface of the masking layer 140 as well as filling into the second opening 145. A second etch back operation is performed to remove the as-deposited spacer layer 108 from the top surface of the masking layer 140. An end point etching can be adopted to use the top surface of the masking layer 140 as a single plane to stop the etch back operation. In connection to FIG. 8, the top surface 125' of the etched-back spacer layer 108 possesses a ripple. In FIG. 11, the masking layer 140 is removed by, for example, by a dilute hydrogen fluoride. The remaining spacer layer 108 acts as a hard mask layer for the subsequent memory cell layers (105A, 105B). A small portion of the spacer layer, or previously called an etch stop layer 108', is positioned over the upper barrier layer 109B. Since a thickness of the etch stop layer 108' is substantially thinner than that of the remaining spacer layer 108, the etch stop layer 108' may be completely removed in the subsequent memory cell patterning operation.

It has been appreciated that using a hard mask that is substantially devoid of oxygen can increase yield of an associated RRAM cell. This is because during patterning of the memory cell 105, the etchant may dissociate oxygen radicals from an oxygen containing hard mask layer (e.g., such as SiO$_2$ or SiON). The dissociated oxygen radicals can subsequently be implanted into the electrode 107, the capping layer 105A, and/or the data storage layer 105B, where the oxygen radicals lead to device failure (e.g., disturb formation of RRAM filament and resetting the RRAM filament). Using a hard mask layer that is substantially devoid of oxygen eliminates such oxygen radicals during patterning of the memory cell 105, leading to a yield increase.

Referring to FIG. 12, the etchant used in the present operation shall etch the upper and lower barrier layer (109B, 109A), the data storage layer 105B, and the capping layer 105A with similar selectivity. In some embodiments, a dry etch operation is used. In other embodiments, the hard mask layer may include silicon-carbide (SiC) or a composite dielectric film that is substantially devoid of oxygen. Note at the end of present operation, the electrode 107 is completely covered by the spacer layer 108.

Figure 13:
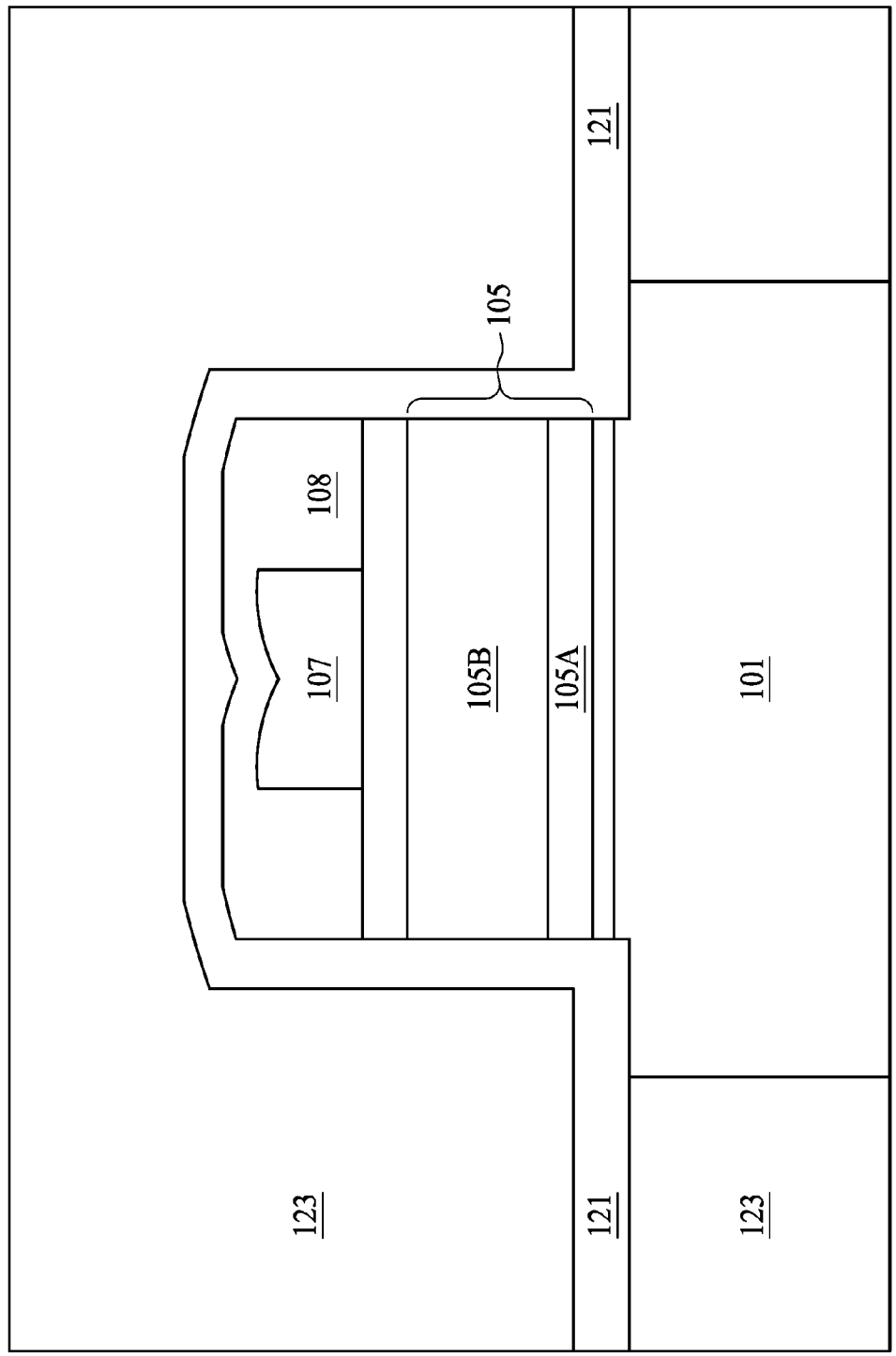
Figure 14:
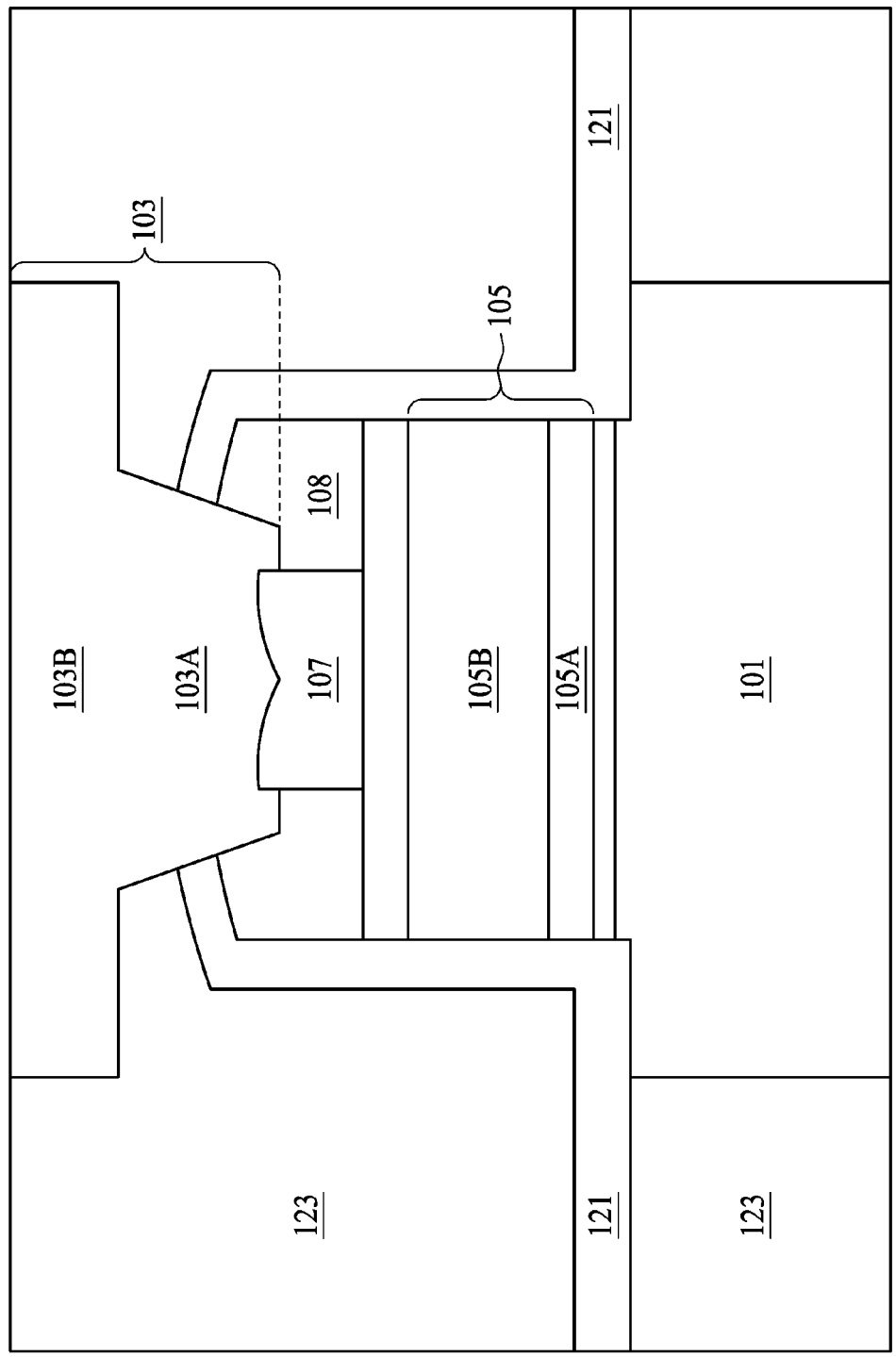

Referring to FIG. 13 and FIG. 14, an electrical connection is formed to connect the electrode 107 and the upper metal layer 103. In FIG. 13, a protection layer 121 is blanket deposited over the memory cell 105, the electrode 107, and the spacer layer 108. In some embodiments, the protection layer 121 is a silicon carbide layer. The protection layer 121 is also formed over the lower metal layer 101 and the dielectric layer 123 surrounding the lower metal layer 101.

In FIG. 14, as shown in cross-section, an upper metal layer 103 is formed at a position abutting the electrode 107. In some embodiments, the upper metal layer 103 comprises a metal via 103A and a metal line 103B. In some embodiments, the upper metal layer 103 may be formed by etching the dielectric layer 123 to form an opening that extends through the protection layer 121 and the spacer layer 108. The opening is then filed with metals by at least one operation of electro-less plating, sputtering, electro plating, PVD, or ALD. In some embodiments, the metals include materials selected from the following: Pt, AlCu, TiN, Au, Ti, Ta, TaN, W, WN, Cu, Ni, Hf, Zr, to form the upper metal layer 103. Note the top surface of the electrode 107 in contact with the metal via 103A of the upper metal layer 103 may include a ripple feature, according to the manufacturing method disclosed herein. Alternatively, the ripple feature can be eliminated when adopting another manufacturing method previously discussed in FIG. 9.

Because the memory cell 105 of the present disclosure is inversely disposed as opposed to the conventional RRAM structure, the electrical connection can be designed to adapt to the configuration of the present disclosure. For example, referring back to FIG. 2, the electrical path originally connected to the BEVA in the conventional RRAM cell can be wired to the upper metal layer 103, whereas the electrical path originally connected to the top electrode in the conventional RRAM cell can be wired to the lower metal layer 101.

Present disclosure provides an RRAM structure that is inversely disposed with respect to the conventional RRAM structure. That is, the BEVA of the present RRAM cell is disposed over the data storage layer instead of under the data storage layer. The term BEVA is not appeared in the present disclosure because the only electrode in the RRAM structure disclosed herein is closer to an upper metal layer instead of to the lower metal layer. Therefore, the interface between the lower metal layer and the RRAM cell can achieve greater flatness. Furthermore, the electrode of the present RRAM cell is formed by a self-aligning operation rather than by a lithography operation. The CD limit and the alignment of the electrode with respect to the center of the RRAM cell are therefore improved.

One embodiment in the present disclosure provides a semiconductor structure, including an $N^{th}$ metal layer, a planar bottom barrier layer over and in contact with the $N^{th}$ metal layer, a data storage layer over the planar bottom barrier layer, an electrode over the data storage layer, and an $(N+1)^{th}$ metal layer over the electrode. N is a positive integer.

One embodiment in the present disclosure provides a memory structure including a lower metal layer, a planar memory cell over the lower metal layer, an upper metal layer electrically coupled to the planar memory cell. The lower metal layer is closer to a transistor region than the upper metal layer. The planar memory cell includes a capping layer in proximity to the lower metal layer; and a high-k dielectric layer over the capping layer.

One embodiment in the present disclosure provides a manufacturing method of a semiconductor structure. The method including forming a bottom metal layer, forming a planar memory layer over the bottom metal layer, forming an electrode over the planar memory layer by a self-aligning operation, and defining a memory cell by patterning the planar memory layer.

Although the present invention and its advantages have been described in detail, it should be understood that various changes, substitutions and alterations can be made herein without departing from the spirit and scope of the invention as defined by the appended claims. For example, many of the processes discussed above cancan be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure, comprising:
   an $N^{th}$ metal layer;
   a planar bottom barrier layer over and in contact with the $N^{th}$ metal layer;
   a data storage layer over the planar bottom barrier layer;
   an electrode over the data storage layer; and
   an $(N+1)^{th}$ metal layer over the electrode;
   wherein N is a positive integer, and the $N^{th}$ metal layer comprises copper.

2. The semiconductor structure in claim 1, wherein the data storage layer comprises a high-k dielectric layer, and a capping layer is disposed between the planar bottom barrier layer and the data storage layer.

3. The semiconductor structure in claim 2, further comprising a planar upper barrier over the data storage layer.

4. The semiconductor structure in claim 1, wherein the electrode is having a ripple surface in connection with the $(N+1)^{th}$ metal layer.

5. The semiconductor structure in claim 1, further comprising a nitride layer surrounding the electrode.

6. The semiconductor structure in claim 5, further comprising a carbide layer surrounding the nitride layer and a portion of the $(N+1)^{th}$ metal layer.

7. The semiconductor structure in claim 1, wherein a width of the electrode is in a range of from about 20 nm to about 40 nm.

8. The semiconductor structure in claim 1, wherein the electrode is disposed substantially at the center over the data storage layer.

9. The semiconductor structure in claim 1, wherein the electrode is in contact with an $(N+1)^{th}$ metal via.

10. A semiconductor structure, comprising:
    a lower metal layer comprising copper;
    a planar data storage cell over the lower metal layer, the planar data storage cell comprising:
        a capping layer in proximity to the lower metal layer; and
        a high-k dielectric layer over the capping layer; and
    an upper metal layer electrically coupled to the planar data storage cell,
    wherein the lower metal layer is closer to a transistor region than the upper metal layer.

11. The semiconductor structure of claim 10, further comprising a planar bottom barrier layer between the capping layer and the lower metal layer.

12. The semiconductor structure of claim 10, wherein the upper metal layer is electrically coupled to the planar data storage cell through an electrode.

13. The semiconductor structure of claim 12, wherein the electrode is disposed substantially at a center of the planar data storage cell.

14. The semiconductor structure of claim 12, wherein a bottom of the electrode in proximity to the high-k dielectric layer is substantially flat.

15. The semiconductor structure of claim 12, wherein a top of the electrode in contact with the upper metal layer comprises a ripple surface.

16. A semiconductor structure, comprising:
    a transistor region;
    a lower metal layer over the transistor region;
    a planar stack over the lower metal layer, the planar stack comprising:
        a capping layer in proximity to the lower metal layer; and
        a dielectric layer over the capping layer; and
    an electrode over the dielectric layer, the electrode comprising a ripple top surface and a sidewall; and
    an upper metal layer over the electrode, electrically coupled to the planar stack,
    wherein a first portion of the sidewall and the ripple top surface of the electrode are in contact with the upper metal layer.

17. The semiconductor structure of claim 16, further comprising a planar upper barrier over the planar stack.

18. The semiconductor structure of claim 16, wherein a second portion of the sidewall of the electrode is in contact with a spacer layer.

19. The semiconductor structure of claim 18, further comprising a protection layer surrounding the planar stack, the spacer layer, the electrode, and a portion of the upper metal layer.

20. The semiconductor structure of claim 16, wherein a metal via of the upper metal layer is in contact with the ripple top surface and the first portion of the sidewall of the electrode.

* * * * *